US005315118A

United States Patent [19]

Mous

[11] Patent Number: 5,315,118

[45] Date of Patent: May 24, 1994

[54] DUAL ION INJECTOR FOR TANDEM ACCELERATORS

[75] Inventor: Dirk J. W. Mous, Nieuwegein, Netherlands

[73] Assignee: High Voltage Engineering Europa B.V., Amersfoort, Netherlands

[21] Appl. No.: 47,744

[22] Filed: Apr. 15, 1993

[51] Int. Cl.[5] .......... H01J 37/147

[52] U.S. Cl. .......... 250/396 ML; 250/492.21

[58] Field of Search .......... 250/396 ML, 295, 492.21; 335/210

[56] References Cited

U.S. PATENT DOCUMENTS 3,563,809 8/1968 Wilson .......... 250/492.21

4,151,420 4/1979 Keller et al. .......... 250/492.21

FOREIGN PATENT DOCUMENTS 57-87055 5/1982 Japan .......... 250/492.21

62-61259 3/1987 Japan .......... 250/396 ML

*Primary Examiner*—Jack I. Berman

*Attorney, Agent, or Firm*—Nields & Lemack

[57] ABSTRACT

A compact ion beam injection apparatus for tandem accelerators wherein the outputs from two independent ion sources, that may be operated continuously, can be selectively chosen and mass analyzed so that the output from any one of the sources can be rapidly selected and efficiently directed to the input point of a tandem accelerator.

13 Claims, 3 Drawing Sheets

DUAL ION INJECTOR FOR TANDEM ACCELERATORS

BACKGROUND OF THE INVENTION

1. Field of the Invention

This invention relates to ion injection arrangements for tandem accelerators, wherein it is possible to select the individual outputs from either one of a pair of continuously operating ion sources to allow the mass analyzed output from either source to be efficiently directed to the injection point of an electrostatic tandem accelerator. Although limitations in scope are not intended, this invention has particular relevance to the fields of MeV Implantation and MeV analysis of thin films.

2. Description of the Prior Art

As the requirements by researchers for reductions of surface contamination become more demanding, there are increasing requests for thin film processing sequences that are followed by a subsequent analysis, all of which to be carried out rapidly and without breaking vacuum. Thus, in researches involving MeV implantation followed by RBS or PIXE analysis it is useful if the individual ion species needed for fabrication and analysis be readily available from the same accelerator. If beam changeover between implantation ions and analysis ions can be made in times of the order of seconds, rather than minutes or hours, the possibility presents itself of analyzing film properties at intermediate points within the production cycle, rather than just at the end.

FIG. 1 shows the basic optical arrangement of a tandem acceleration system for both implantation and analysis. The ion optical arrangement is usually such that the injection point remains at a fixed location conjugate to the waist which must be present at the center of the stripper canal within the high voltage terminal. To achieve efficient injection, negative ions from a suitable source must be focussed to produce a beam waist at the injection point which is external to the accelerator.

A typical arrangement of the components which have been previously used to couple two independent ion sources to a tandem system has consisted of a multiplicity of optical elements arrayed along two input channels connected to a reversible inflection magnet. Such a system suffers from several disadvantages: First, the system tends to be large and occupies a substantial amount of laboratory floor space. Secondly, because of size several vacuum systems are needed to maintain adequate vacuum pressures, and so the fabrication costs for producing the system tend to be high. Thirdly, the inflection magnet provides poor momentum resolution because the deflection angle is small. Fourthly, the direction of the inflecting magnetic field must reverse when the output is switched from one ion source to the other, so that the power supply must provide dual polarity or some polarity reversing switch must be included.

SUMMARY OF THE INVENTION

The present invention relates to a compact and economical apparatus which solves many of the foregoing problems. It allows two independent sources to be operated continuously in stable modes, with switching possible between sources in times of the order a few seconds.

The features of this invention are:

1. Both sources can be operated stably on a continuous basis so that temperatures and gas pressures can be optimized for beam output and purity.
2. Ions of any mass produced by either source can be rapidly selected using a compact uniform field momentum analysis system which transports ions of the wanted ions through a mass defining aperture at the tandem injection point.
3. Ions from both sources are bent in the same direction and with comparable radii of curvature by the magnetic inflector. For the preferred geometry, which is an inflection angle close to 90° for both sources, the geometry can be compact and economical.
4. Because ions from both sources are bent in the same direction the polarity of the magnet power supply does not change, thereby simplifying magnetic field controls and making for a more compliant computer control protocol.

BRIEF DESCRIPTION OF THE DRAWINGS

Operation of the invention may best be understood from the following detailed description thereof, having reference to the accompanying drawings, in which.

DESCRIPTION OF THE PREFERRED EMBODIMENT

Figure 1:
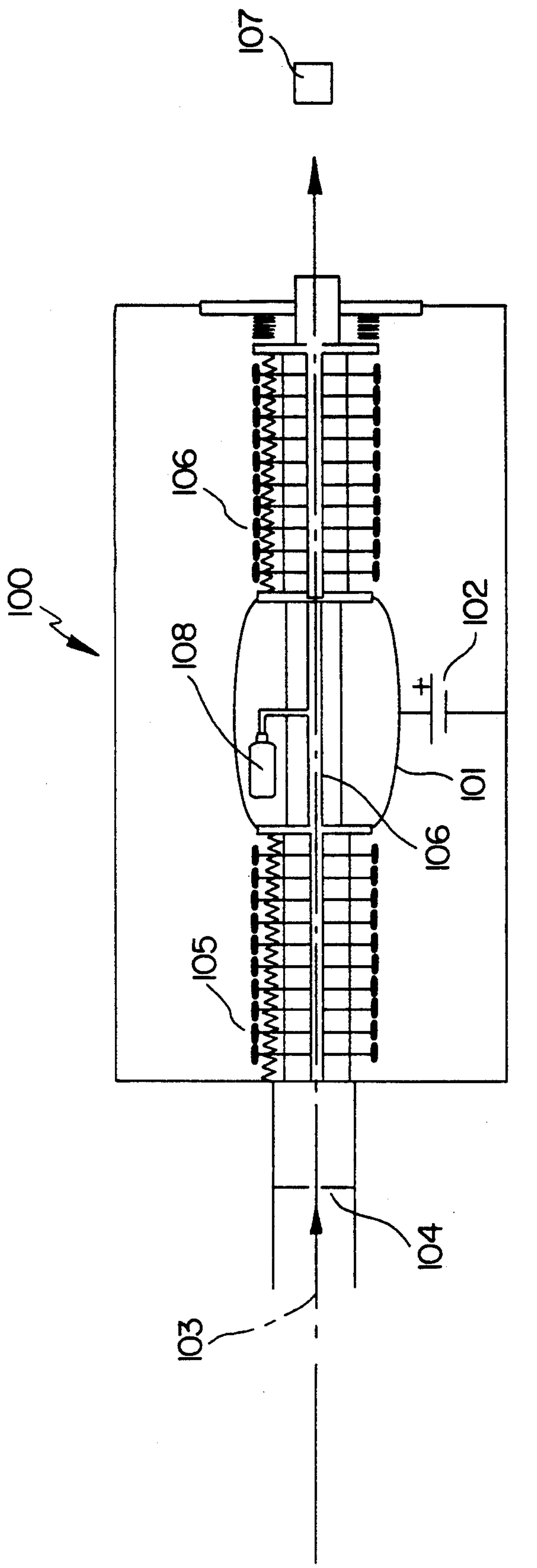
FIG. 1 (PRIOR ART)
FIG. 1 is a schematic representation of a tandem accelerator.

Referring to the drawings and first to FIG. 1 thereof, therein is shown a schematic illustration of a tandem accelerator 100. Such a tandem accelerator includes a high voltage terminal 101 which is maintained at a high positive voltage by a suitable high voltage power supply 102. Negative ions 103 from a suitable injector (not shown) are directed sequentially through a mass defining aperture 104, a low-energy acceleration tube 105, a stripper 106, a high-energy acceleration tube 106, and into an implant/analysis location 107. A suitable amount of gas is maintained within the stripper by a stripper gas supply 108, and the effect of this gas is to convert the incoming negative ions into positive ions. Beam waists are located at the mass defining aperture and at the narrowest part of the stripper.

Figure 2:
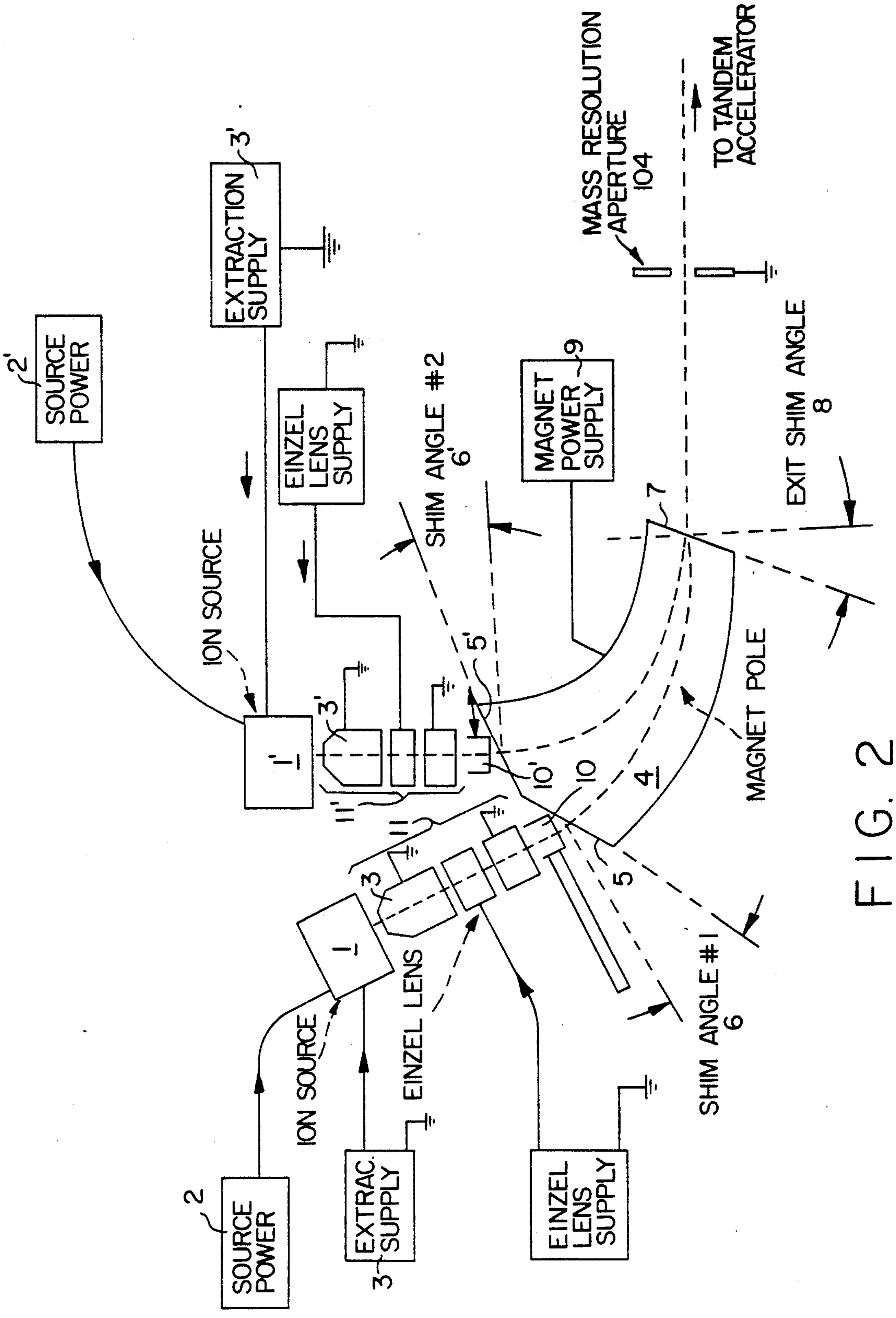
FIG. 2 is a schematic representation of the present invention showing a dual source system for tandem injection.

The principles of the present invention are shown in FIG. 2. Referring thereto, in conjunction with FIG. 1, the device shown in FIG. 2 constitutes the injector which injects negative ions through the mass defining aperture of FIG. 1 and thence through the tandem accelerator. There are two negative ion sources 1,1′, each having its own source of power 2,2′, and from which negative ions are extracted by respective extraction supplies 3,3′. It can be seen that both sources 1,1′, can be operated independently: each has separate source head supplies, and extraction power supplies. The output of ions from each of these sources is independently focused through the mass defining aperture 104 using the well known effects of a uniform-field magnetic deflector with non normal shim angles at the entrance to and exit from the magnetic filed. Thus, the negative ions from each source 1,1′ enter a uniform-field magnetic deflector 4 through respective entrance shims 5,5′ having non-normal angles 6,6′ (i.e. angles which are not perpendicular to the beam trajectory). The beams share a common exit shim 7, also having a non-normal angle 8. The magnetic deflector is energized by a suitable magnet power supply 9. Calculation procedures for theoretically predicting the appropriate values for these shim angles and the desirable object location for each source to produce double focussing at the tandem acceptance aperture 104 have been presented by a number of authors (H.A. Enge, *Focussing of Charge Particles* V2, p203, (1967) Edited by A. Septier Published by Academic Press, N.Y.) making possible precise designs for each channel.

One important feature of the disclosed geometry is that the deflection for both sources is in the same direction so that the polarity of the magnetic field never changes. Thus, reversal capabilities are not needed for the associated power supply and there is no need for complex switching and interlocks to prevent this supply from being reversed under load. Under these conditions computer control becomes more reliable than in existing systems.

The speed of switching between the two sources shown in FIG. 2 is only limited by the reaction time of the computer controls, the slew rate of the magnet power supply and by the effects of any eddy currents which may flow in the magnet poles and in the iron return yoke. It will be clear to those skilled in the art that the magnet poles and the magnetic return yoke of the magnetic deflector 4 can be fabricated from thin sheets of steel so that eddy currents will not significantly effect the speed of switching.

It will also be clear to those skilled in the art that removable Faraday cups or obstructions 10,10' can be located in the region immediately prior to the magnetic field allowing the ions from each source 1,1' to be intercepted or injected into the magnetic deflector 4 at will. Thus, it becomes possible to switch from one source to the other source by removing the correct Faraday cup and by adjusting the magnetic field to the appropriate values for transmission of the wanted ions through the mass defining aperture.

In practice, the variation in deflection angles between the ion beams leaving each source is usually dictated by the physical geometry of each source and by electrical breakdown. For most sources their physical size is usually sufficiently great that the entrance to the magnet field is quite wide and it is possible to machine unique shim angles for each of the separate beam entry locations allowing the focussing for each beam to be stigmatic.

Figure 3:
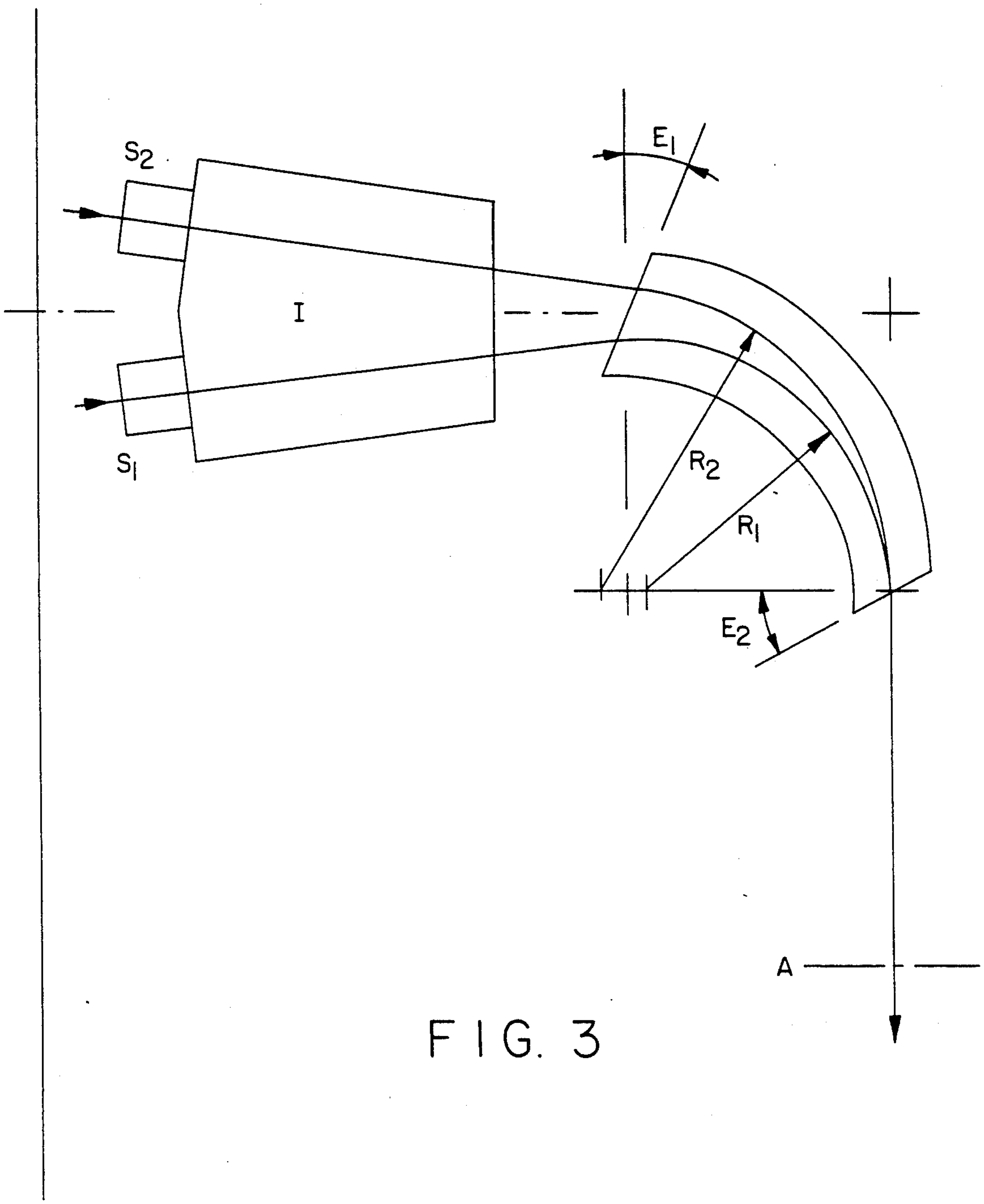
FIG. 3 is a schematic representation of a simplified switchable dual ion source apparatus.

For many tandem systems, however, a complete elimination of astigmatism may not be necessary and to those skilled in the art it will be clear that when the individual sources are small and hence can be set close together it may be possible to find geometries where a single planar shim cut will make the system 'nearly' stigmatic. Such a geometry is represented in FIG. 3.

For compactness, it is useful if the mean angle of deflection of the two incoming ion beams is approximately 90° . Compactness can be further increased when both ion sources are accommodated in one common structure as is shown in FIG. 3. Using such a geometry the injector and its associated power supplies adds a minimal length to that of the accelerator system. In addition, the mass resolution is adequate for most tandem applications; with an inflection radius of curvature of ~0.30 meters a resolution, $M/\Delta M$, of ~50 can be easily achieved.

While the appropriate combination of pole edge shim angles can provide stigmatic focussing for both sources, in many geometries it may be found that the focussing provided by a uniform field, alone, will be too weak to produce a compact design or that the necessary pole gap to allow good transmission will be excessively great. In this case additional lenses 11,11' can be introduced between each source and the entrance to the magnetic field to converge the ions leaving each source 1,1' and produce a virtual image of the source at the appropriate location for the wanted focussing. The preferred embodiment is an electrostatic einzel lens 11,11'; such a lens can provide symmetrical focussing, is compact and provides a focal strength independent of the particle mass. However, for those skilled in the art it will be apparent that other focussing structures such as electrostatic quadrupole triplets and doublets are also candidates.

Having thus described the principles of the invention, it is to be understood that although specific terms are employed, they are used in a generic and descriptive sense and not for purposes of limitation, the scope of the invention being set forth in the following claims.

I claim:

1. An ion generation system adapted to direct ions from any one of a plurality of ion sources through a single defining aperture, comprising in combination: at least two ion sources each having an independent ion extraction electrode and independent power sources; a single uniform field magnetic analyzer having an independent ion-entrance location for ions from said sources respectively and common ion-exit location; and means for directing ions from each source through said analyzer and thence through said single defining aperture, said analyzer having a magnetic field which is varied in an appropriate manner to deflect in the same direction ions from any one of said ion sources and through the angle necessary for passage of the said ions through said single defining aperture, said magnetic analyzer having a non-normal field boundary at said ion-exit location and a unique non-normal boundary at each of said ion-entrance locations, whereby focussing is achieved for the ions from each of said source.

2. Apparatus according to claim 1, wherein focussing lenses are located between each of the said ion sources and the point where ions from the said ion source enter the uniform field magnetic analyzer.

3. Apparatus according to claim 1, wherein removable beam obstructions are inserted to individually select one of the two beams.

4. Apparatus according to claim 3, wherein said removable obstructions are in the form of Faraday collectors.

5. Apparatus according to claim 1, wherein said uniform field magnetic analyzer is laminated from plates of a magnetic material.

6. Apparatus according to claim 1, wherein the mean angle of deflection of the incoming on beams from both sources is ninety degrees.

7. Apparatus according to claim 1, wherein said ion sources have a common set of power supplies.

8. Apparatus according to claim 1, wherein said ion sources are accommodated in a single vacuum housing.

9. An ion generation system adapted to direct ions from any one of a plurality of ion sources through a single defining aperture, comprising in combination: at least two ion sources each having an independent ion extraction electrode and independent power sources; a single uniform field magnetic analyzer having an independent ion-entrance location for ions from said sources respectively and common ion-exit location; and means for directing ions from each source through said analyzer and thence through said single defining aperture, said analyzer having a magnetic field which is varied in an appropriate manner to deflect in the same direction ions from any one of said ion sources and through the angle necessary for passage of the said ions through said single defining aperture, said magnetic analyzer having a non-normal field boundary at said ion-exit location and a single non-normal planar boundary for both of said ion-entrance locations, whereby focussing is achieved for the ions from each of said source.

10. Apparatus according to claim 9, wherein focussing lenses are located between each of the said ion sources and the point where ions from the said ion source enter the uniform field magnetic analyzer.

11. Apparatus according to claim 9, wherein removable beam obstructions are inserted to individually select one of the two beams.

12. Apparatus according to claim 11, wherein said removable obstructions are in the form of Faraday collectors.

13. Apparatus according to claim 9, wherein the mean angle of deflection of the incoming on beams from both sources is ninety degrees.

* * * * *